United States Patent
Zhang et al.

(10) Patent No.: US 6,992,608 B2
(45) Date of Patent: Jan. 31, 2006

(54) CURRENT-STEERING DIGITAL-TO-ANALOG CONVERTER HAVING A MINIMUM CHARGE INJECTION LATCH

(75) Inventors: Weibiao Zhang, Plano, TX (US); Bertan Bakkaloglu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 53 days.

(21) Appl. No.: 10/823,046

(22) Filed: Apr. 13, 2004

(65) Prior Publication Data

US 2005/0225465 A1    Oct. 13, 2005

(51) Int. Cl.
    *H03M 1/66*    (2006.01)
(52) U.S. Cl. .................. 341/144; 341/145; 341/136
(58) Field of Classification Search ................ 341/144, 341/145, 136, 118, 120
    See application file for complete search history.

(56) References Cited

U.S. PATENT DOCUMENTS

| | | | | |
|---|---|---|---|---|
| 5,162,800 A | * | 11/1992 | Ogawara | 341/144 |
| 5,706,006 A | * | 1/1998 | Hattori | 341/144 |
| 6,100,833 A | * | 8/2000 | Park | 341/144 |
| 6,268,816 B1 | * | 7/2001 | Bult et al. | 341/144 |
| 6,353,402 B1 | * | 3/2002 | Kanamori | 341/118 |
| 6,392,573 B1 | * | 5/2002 | Volk | 341/118 |
| 6,628,219 B2 | * | 9/2003 | Dedic | 341/144 |

* cited by examiner

*Primary Examiner*—Jean Jeanglaude
*Assistant Examiner*—John B Nguyen
(74) *Attorney, Agent, or Firm*—J. Dennis Moore; W. James Brady, III; Frederick J. Telecky, Jr.

(57) ABSTRACT

A latch architecture for driving unit current cell of a current-steering digital-to-analog converter (DAC) which reduces the drain-source voltage variation of the output current-source transistors and reduces the coupling of unwanted injection of input digital signals as well as clock signals is presented herein. Moreover, this latch helps to achieve lower glitch during code transition with improved dynamic performance. The latch effectively uses the intrinsic RC delay of most transistors within the latch architecture in order to achieve optimal crossing points of complementary control signals. Unwanted input injection or cross-talk is reduced by introducing transistors (904, 906, 932 and 934) that are off during code transitions without compromising the DAC update speed. Conflicts between currently held and new inputs are avoided in an effort to reduce the harmonic distortion. Furthermore, the distortion as a result of the clock signal fed through each transistor in the first and second subcircuit portions cancel each other.

4 Claims, 7 Drawing Sheets

CURRENT-STEERING DIGITAL-TO-ANALOG CONVERTER HAVING A MINIMUM CHARGE INJECTION LATCH

FIELD OF THE INVENTION

The present invention relates to CMOS current-steering digital-to-analog converters (DACS), and, more particularly, to a CMOS current-steering DACS having a minimum charge injection latch.

BACKGROUND OF THE INVENTION

As the demands for video signal processing, digital signal synthesis, and high-accuracy digital-to-analog converters (DACs) generate an increased need for higher clock frequencies and dynamic ranges, CMOS current-steering DAC architectures provide the best structure for most of these applications. CMOS current-steering DACS may be integrated within digital circuits to yield systems that have cost and power consumption advantages. Furthermore, CMOS current-steering DACS are intrinsically faster and more linear than competing architectures such as resistor-string DACs.

Conversion from digital-to-analog (D/A) is the process of converting digital codes into a continuous range of analog signal levels. Digital codes are typically converted to analog voltages by assigning a voltage weight, or current weight, to each bit in the digital code and summing the voltage or current weights of the entire code. A digital-to-analog converter (DAC) having weights using the power of two is called a binary weighted DAC. Resistor-string DACs are DACs that produce a voltage output. Current-steering DACs are DACs that produce analog current outputs.

Current-steering DACs are implemented using an array of matched current sources which are unity decoded or binary weighted. There are a variety of architectures in which a current-steering DACs may be implemented from two-stage, interpolated, or segmented architectures. Random mismatches between each the current source, however, present a problem of intrinsic inaccuracy.

For simplicity, a 3-bit current-steering DAC using thermometer decoding is depicted in FIG. 1. As shown the 3-bit current-steering DAC is a structure that is implemented with current sources that are connected to PMOS output switches. In general, the unit current source is normalized to 1. The digital inputs are clocked into the decoder 102. The decoder 102 translates the input digital code to a corresponding control code ($S_1$–$S_7$, $R_1$–$R_7$) that steers the current sources to the output across resistors $R_{10}$ and $R_{20}$. Latch 104 captures these control codes ($S_1$–$S_7$, $R_1$–$R_7$) to generate a second set of control codes ($Y_1$–$Y_7$, $Y_{1B}$–$Y_{7B}$). Assuming the current sources are ideal, the output current is proportional to the input digital control word. In the alternative, current-steering DAC architectures can also be implemented using current sinks and NMOS output switches. In general, the output switches are either off or in the saturation region during switching in order to reduce the settling time. The timing diagram and transfer curve of the output versus input code sweep is shown in FIG. 2. In operation, as shown there is a point in time when the switches that generate the second set of control codes ($Y_1$–$Y_7$, $Y_{1B}$–$Y_{7B}$) are simultaneously off. At this point, there will be a glitch in the output current as shown in FIG. 2.

Major factors that determine the quality of performance of DACs are resolution, sampling rate, speed, and linearity. The accuracy of the DAC's measurement and conversion is typically specified by the converter's linearity. "Integral linearity" is a measure of linearity over the entire conversion range. It is defined as the deviation from a straight line drawn between the maximum point and through zero (or the offset value) of the conversion range. "Differential linearity" is the linearity between adjacent steps of the analog output. In addition, differential linearity is a measure of the monotonicity of the converter. The converter is said to be monotonic if increasing input values result in increasing output values. As stated previously, current-steering DACs usually have a faster settling time and better linearity than those resistor-string DACs.

Within a current-steering DAC, static errors, such as differential nonlinearity (DNL) and integral nonlinearity (INL), are caused by the mismatch among the unit current sources. Dynamic nonlinearity, such as spurious-free dynamic range (SFDR), is associated with current-source switching and settling. Dynamic nonlinearity is caused by various factors including, but not limited to (1) an imperfect synchronization of the input signals, (2) current variation due to a drain voltage variation of the current sources, (3) crosstalk between a new input digital code and control signals latched from the previous input digital code, or (4) the interference generated by the clock signal which is feed through to the output.

FIG. 3 represents a unit cell 300 from the current steering DAC 100 of FIG. 1, whereas FIG. 4 displays the conventional switch-driving scheme and drain voltage variations. As shown, the crossing point of the control signals is in the middle of the high voltage (VH) and the low voltage (VL). At the crossing point, the output switches, 302 and 304, are both off. During the switching from the output ($I_{OUT}$) to the complementary output ($I_{OUTB}$), the output switches, 302 and 304, can be both off for some time, this is equivalent to a high output impedance current source having no valid output voltage, therefore the drain voltage $V_x$ at node X can have a variation $\Delta V_x$. This variation not only impacts the accuracy of the output through channel length modulation, but also impacts the settling of the output which leads to the harmonic distortion and degradation of the SFDR. In order to reduce the variation, it is preferred to have a switch crossover point where there is no time when both switches are off.

Another approach as shown in FIG. 5 is a delayed driving scheme which reduces the variation of the drain node voltage. The input synchronization is realized by using two traditional latches as implemented using switches 504, 506, 508, and 510 in front of the delayed driving block. As shown in FIG. 6, the crossing points are lower than the middle point (VH+VL)/2 for PMOS output switches, 514 and 516; while the crossing points are higher than the middle point (VH+VL)/2 for NMOS output switches, 302 and 304 of FIGS. 3 and 4.

FIGS. 7 and 8 illustrate another current-steering DAC having a driving scheme that uses ratio logic latching to generate similar complementary control signals, Y and $Y_B$. In operation, when the clock signal CLK is low, the outputs do not change. When the clock signal CLK switches to high, complementary inputs SEL and SELB are latched in and the output propagates to the current switches, 712 and 714. Due to intrinsic delay, the outputs crossover at a point lower than the middle point. This is useful when driving PMOS output transistors as displayed in FIG. 8. It is easy to flip the structure to have crossing point higher than the middle point and drive NMOS output switches, 712 and 714. This latch architecture, however, suffers from a cross-talk problem where the new inputs to the latch during the clock signal CLK low period leak to the outputs where a previous value is stored. If SEL and SELB change when the clock signal CLK is low, a glitch will appear at the latch outputs as is shown in FIG. 9. As a result, signal dependent current error is induced at the current source outputs, Y and $Y_B$. This glitch energy is related to input frequency and causes harmonic distortion and SFDR degradation.

A third implementation of a current-steering DAC is illustrated in FIG. 10. An acceptable crossing point of its output is achieved using fast rising and falling times instead of the uses of an intrinsic delay as illustrated by the structure in FIG. 7. The advantage is a higher performance speed. In addition to higher speed, the unwanted crosstalk is reduced by the NMOS switches, $s_1$ and $s_2$. Clock feed through is suppressed by the cross-coupled weak inverters implemented using switches 814, 816, 818, and 820, following the switches, $s_1$ and $s_2$. If the new inputs SEL and SELB are different from the old inputs being held by the inverters 814, 816, 818, and 820, there will be a conflict between the new inputs and the previous input held by the inverters 814, 816, 818, and 820. The number of code conflicts depends upon the difference between the old and new inputs. This contention causes asynchronous switching between the current cells which degrades the SFDR. As a result, the holding inverters, 814, 816, 818, and 820, must be much weaker than the decoder driver (not shown).

The present invention is directed to overcoming, or at least reducing the effects of one or more of the problems set forth above.

SUMMARY OF THE INVENTION

To address the above-discussed deficiencies of current-steering DACs, the present invention teaches a novel current-steering DAC that reduces the coupling of unwanted injection of a digital input signal and clock signal. This DAC includes a current cell driving circuit and a current cell, wherein the current cell driving circuit includes a decoder and a latch. The current cell driving circuit generates a first and second synchronous control signal. The decoder decodes the digital input signal into a first and second code sequence signal; while the latch latches the first and second code sequence signal depending upon the clock signal and provides the first and second synchronous control signal. The current cell includes output current source transistors that operate as a current source depending upon the first and second synchronous control signals. The latch, having transistors, reduces the drain to source voltage variation of the output current source transistors. Furthermore, the latch reduces the coupling of unwanted injection of the digital input signal and the clock signal by maintaining its transistors in the off position during code transitions without compromising the DAC update speed.

Advantages of this design include but are not limited to a novel latch architecture for driving unit current cell of a current-steering digital-to-analog converter (DAC) that provides synchronous control signals at its output switches, reduces the drain-source voltage variation of the output current-source transistors. Moreover, this latch architecture reduces the coupling of unwanted injection of input digital signals as well as clock signals. Compared to prior architectures, this latch helps to achieve lower glitch during code transition with improved dynamic performance.

These and other features and advantages of the present invention will be understood upon consideration of the following detailed description of the invention and the accompanying drawings.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

Figure 12:
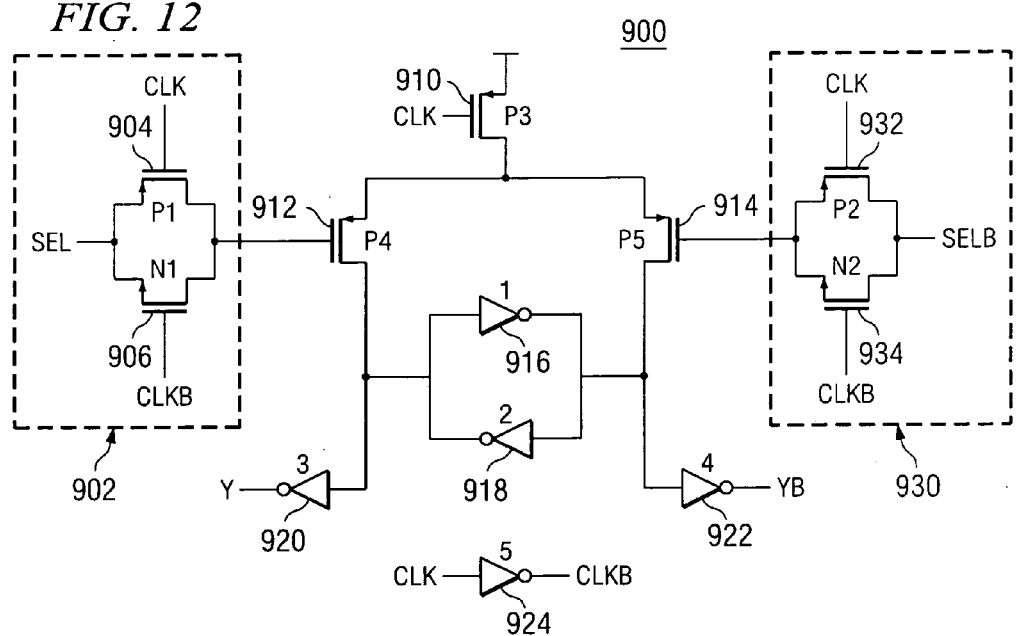
FIG. 12 illustrates the novel latch device in accordance with the present invention.

FIG. 12 shows a the latch architecture in accordance with the present invention. This latch architecture generates control signals for the PMOS output switches that are included within the DAC current cell. The DAC in accordance with the present invention will include a current cell driving circuit and a current cell, wherein the current cell driving circuit includes a decoder and the latch architecture in accordance with the present invention. The current cell driving circuit generates a first and second synchronous control signal, wherein the decoder decodes the digital input signal into a first and second code sequence signal and the latch latches the first and second code sequence signal depending upon the clock signal and provides the first and second synchronous control signal. The current cell includes output current source transistors that operate as a current source depending upon the first and second synchronous control signals. The latch, having transistors, reduces the drain to source voltage variation of the output current source transistors. Furthermore, the latch reduces the coupling of unwanted injection or cross talk of the digital input signal and the clock signal by maintaining its transistors in the off position during code transitions without compromising the DAC update speed.

Specifically, as shown in FIG. 12, includes a first subcircuit portion 902, a second subcircuit portion 930, a first PMOS transistor 910, a second PMOS transistor 912, a third PMOS transistor 914, a first inverter 916, a second inverter 918, a third inverter 920 and a fourth inverter 922. The first subcircuit portion 902 includes a PMOS transistor 904 and an NMOS transistor 906 whereby the source nodes and the drain nodes of each transistor couple together. The gate node of transistor 904 couples to receive the clocking signal and the gate node of transistor 906 couples to receive the inverted clock signal provided through inverter 924. The second subcircuit portion 930 is arranged similar to that of the first subcircuit portion 902, wherein transistors 932 and 934 couple in the same fashion as that of transistors 904 and 906.

PMOS transistor 910 includes a source node connected to the power supply, a gate node coupled to receive the clock signal and a drain node that connects to the source nodes of PMOS transistors 912 and 914. The gate nodes of transistors 912 and 914 connect to the output nodes of the first and second subcircuit portions, 902 and 930, respectively.

Inverters 916 and 918 are coupled in parallel opposing one another between the drain nodes of PMOS transistors 912 and 914. Inverters, 920 and 922, couple to a respective one of the drain nodes of PMOS transistors 912 and 914.

Figure 1:
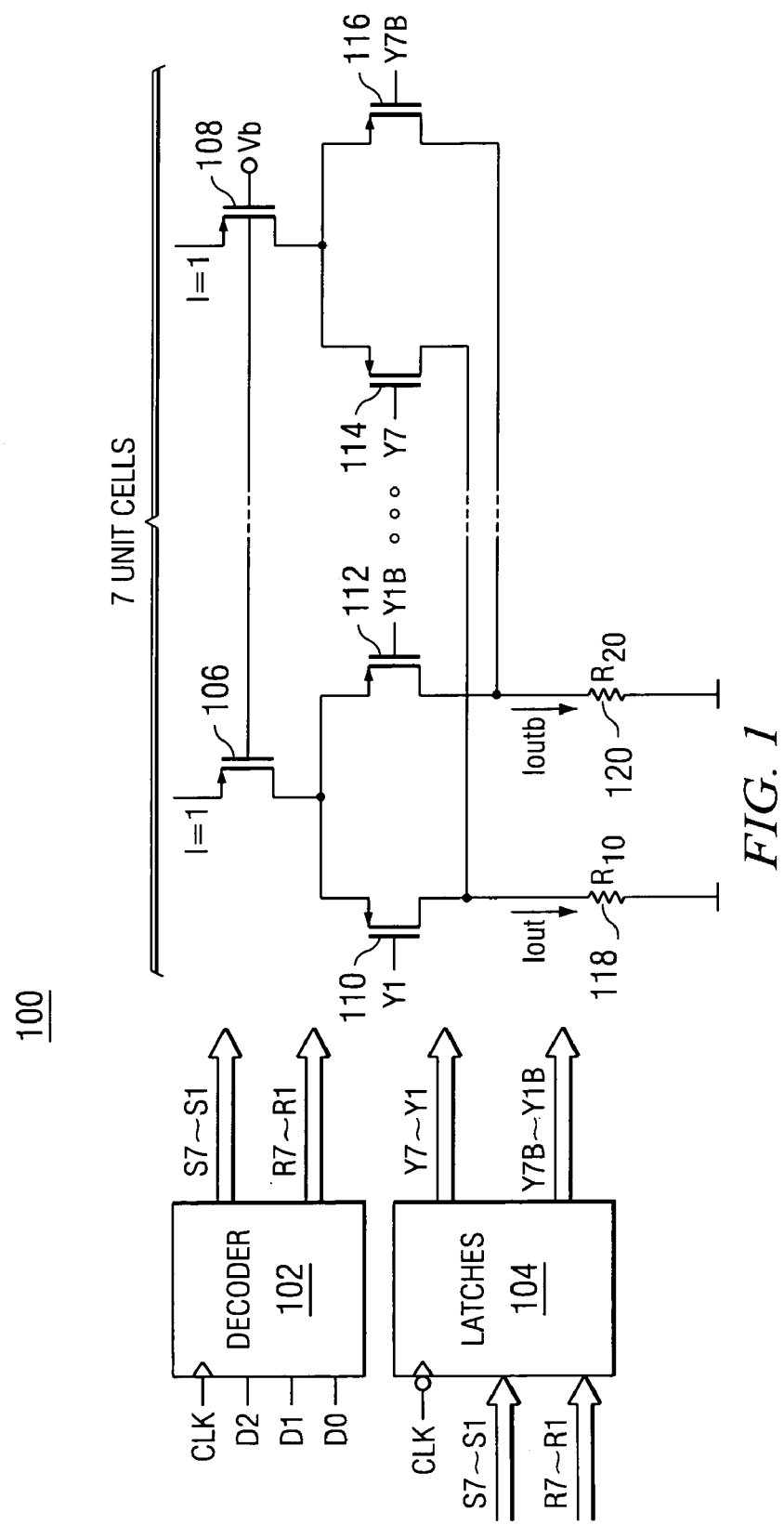
FIG. 1 illustrates a known three bit current-steering DAC architecture.
Figure 2:
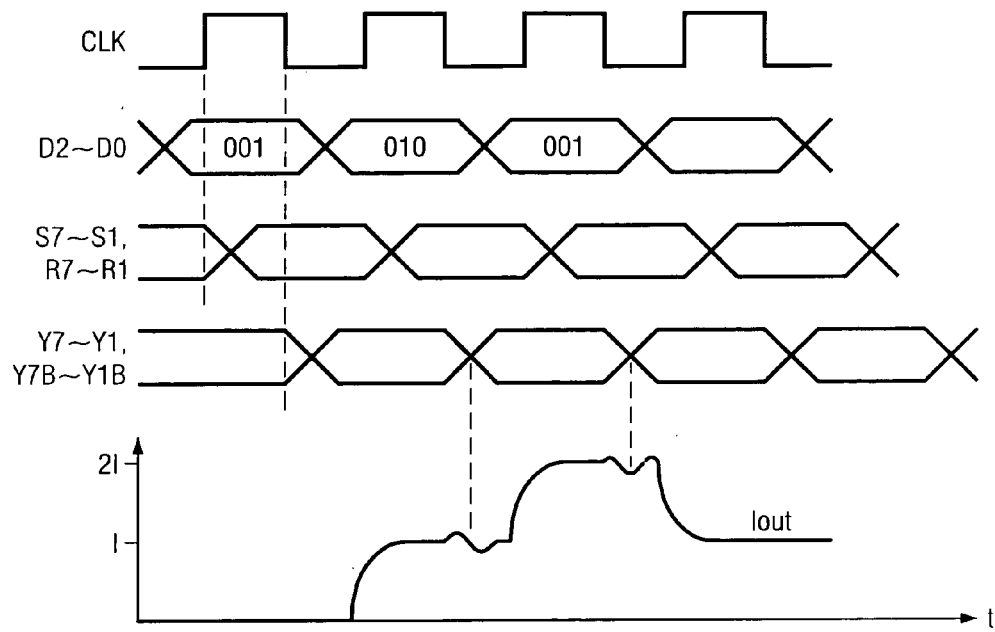
FIG. 2 displays the timing diagram for the three-bit current-steering DAC of FIG. 1.
Figure 3:
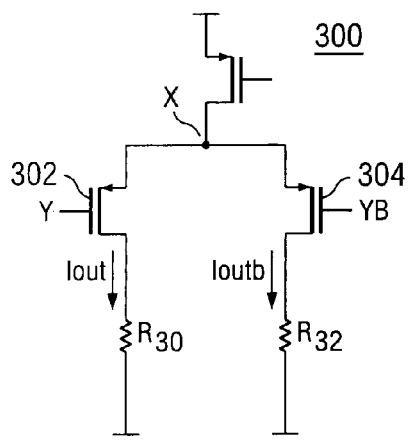
FIG. 3 shows a portion of the current cell of the DAC in FIG. 1.
Figure 4:
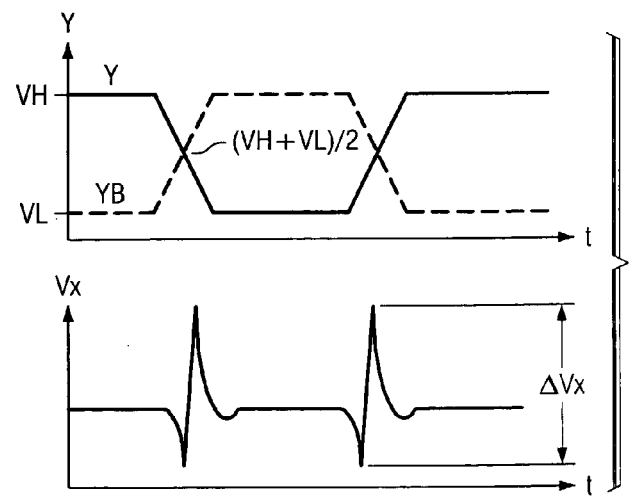
FIG. 4 illustrates the timing diagram of the current cell of FIG. 3.
Figure 5:
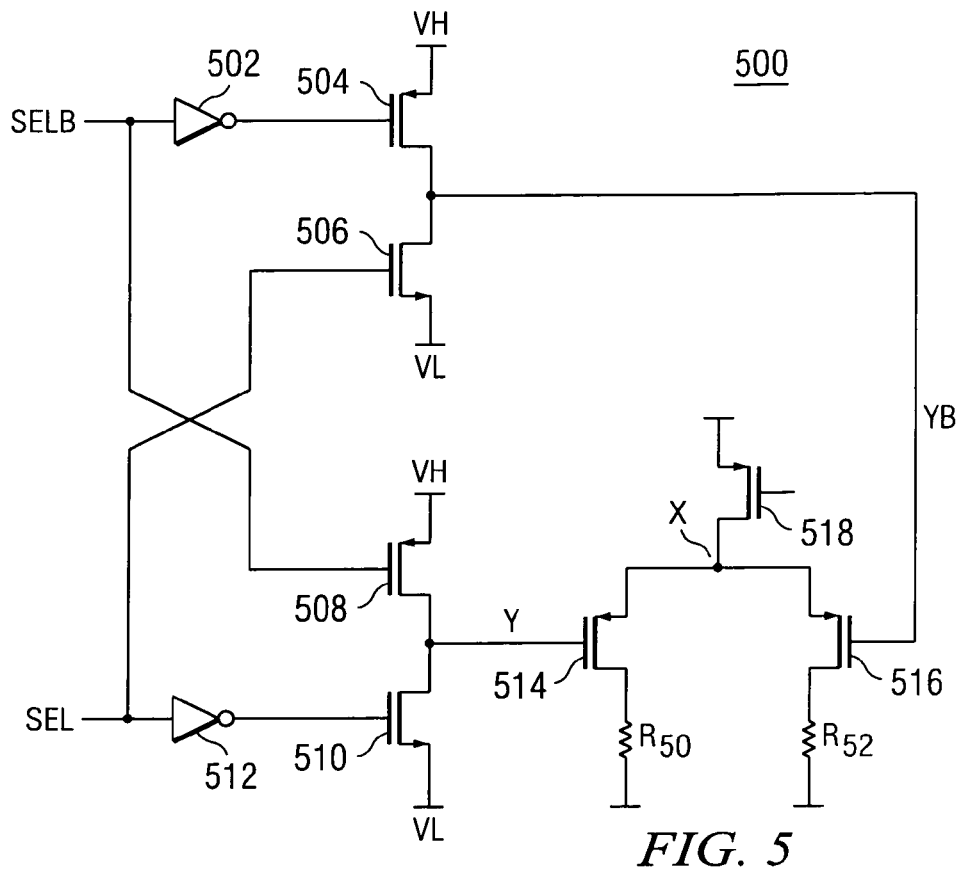
FIG. 5 displays a second embodiment of a known latch device.
Figure 6:
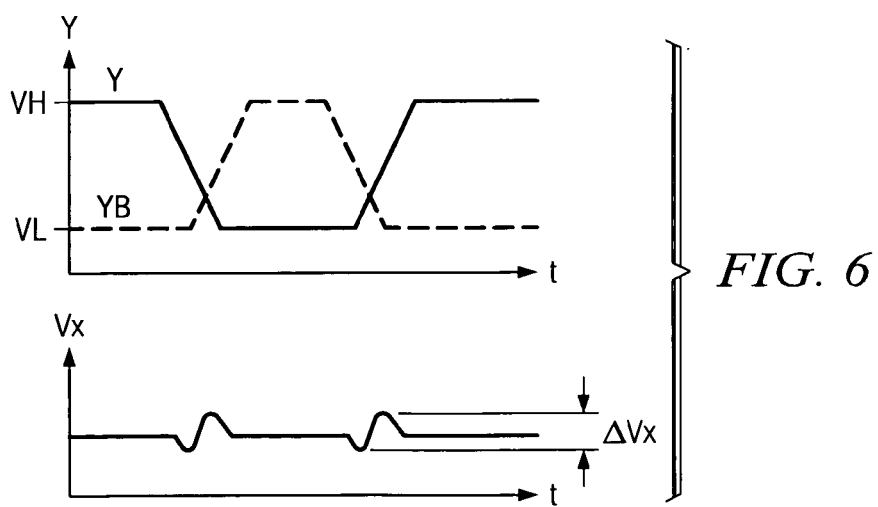
FIG. 6 shows the timing diagram of the known latch device of FIG. 5.
Figure 7:
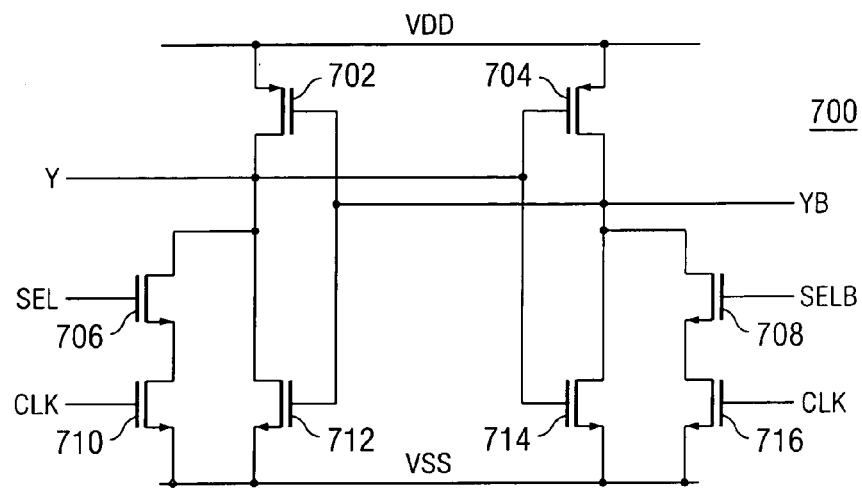
FIG. 7 displays a third embodiment of a known latch device.
Figure 8:
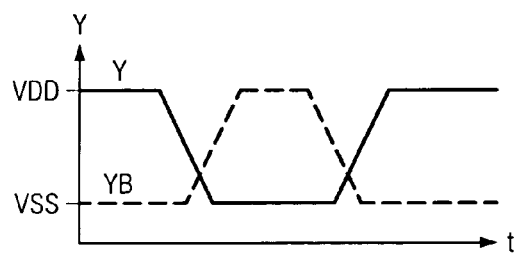
FIG. 8 illustrates the timing diagram of the output voltage of the known latch device of FIG. 7.
Figure 11:
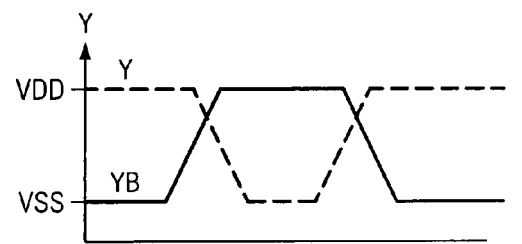
FIG. 11 shows the timing diagram for the known latch device of FIG. 10.
Figure 13:
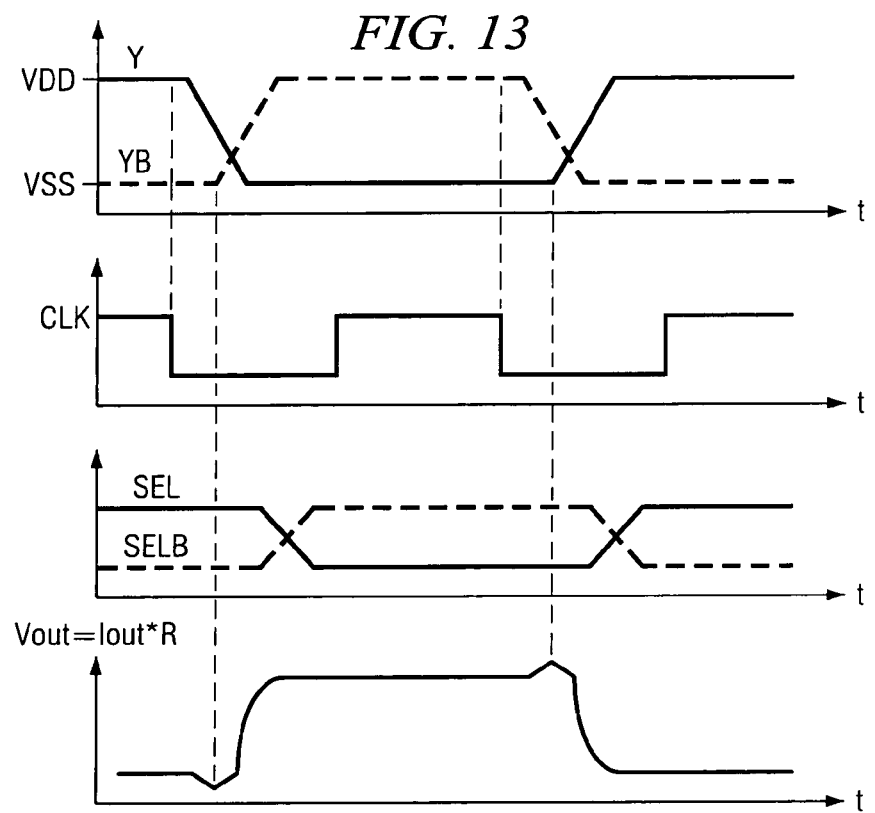
FIG. 13 displays the timing diagram of the latch device of FIG. 12.
Figure 14:
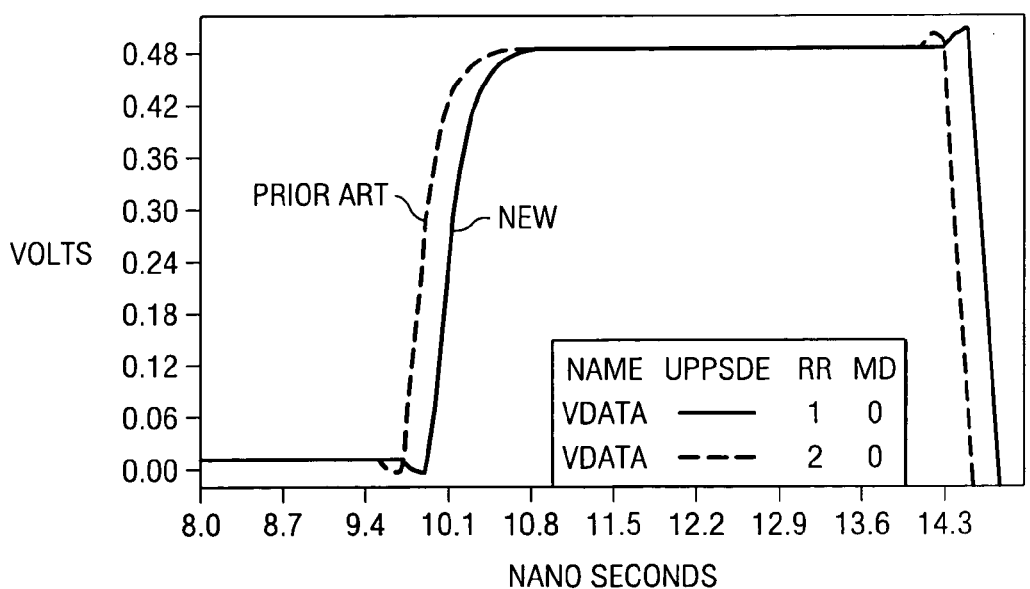
FIG. 14 show a transient comparison between the DAC output voltages of the latch of FIG. 12 compared to the latch of FIG. 10.

In operation, when the clock signal CLK is low, inputs SEL and SELB are propagated through to outputs, Y and YB. When the clock signal CLK is high, however, transistors, 904, 906, 932 and 934, are off and outputs, Y and YB, maintain their previous values. When comparing the latch architecture of FIG. 12 with that of FIG. 7, the crosstalk of the inputs in the latch architecture in accordance with the present invention are isolated more because transistors, 904, 906, 932 and 934, are off. When the clock signal CLK switches from low to high, the effects of the clock signal feed through transistors, 904, 906, 932 and 934, cancel each other. In addition, the exclusion of cross-coupled inverters in known latch architectures after the switches (or transistors 904, 906, 932 and 934) eliminates asynchronous switching among different current cells due to conflicts between the new inputs and previous inputs. Moreover, when the clock signal CLK goes from low to high, PMOS transistor 910 switches off before the NMOS transistors 906 and 934 since the inverted clock signal CLKB is delayed by inverter 924. As a result, the glitches appearing in the flat area of output signals, Y and YB, are reduced as is shown in FIG. 13. Furthermore, when the clock signal CLK goes from high to low, PMOS transistors 904, 910, and 932 switch on at the same time and, thereby, the glitches appearing in the flat area of output signals, Y and YB, during transition time are reduced.

Figure 9:
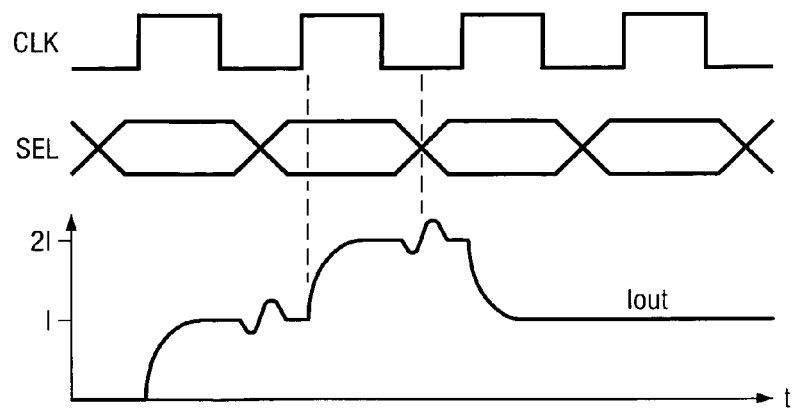
FIG. 9 further illustrates the timing diagram of the known latch device of FIG. 7.
Figure 10:
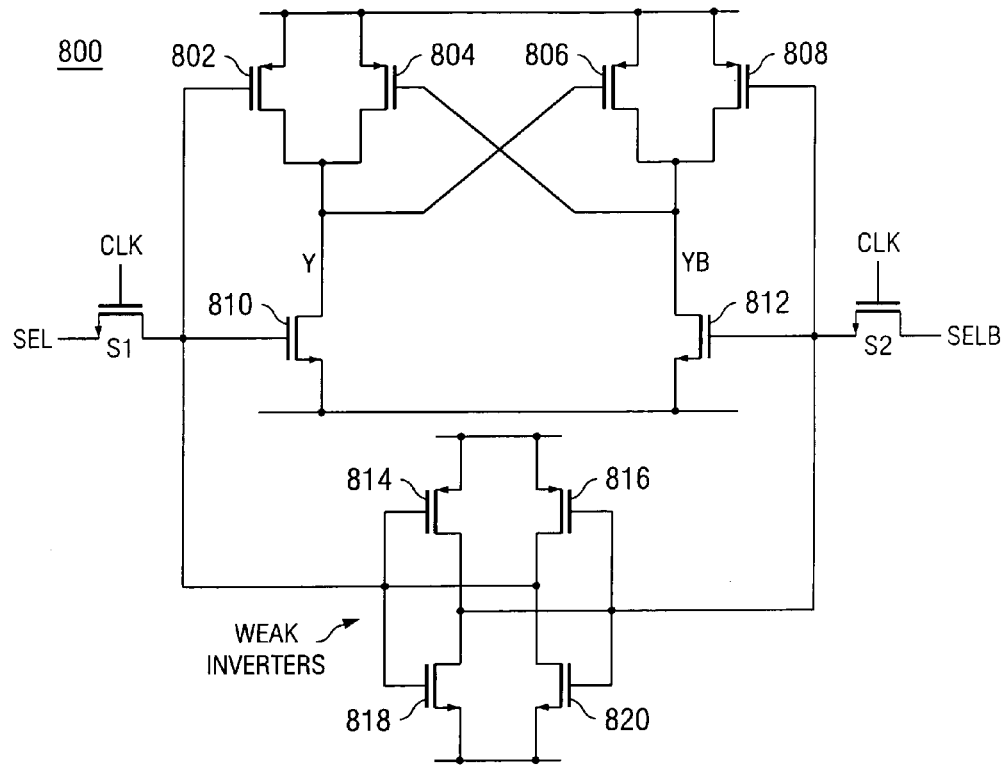
FIG. 10 displays a fourth embodiment of a known latch device.
Figure 15A:
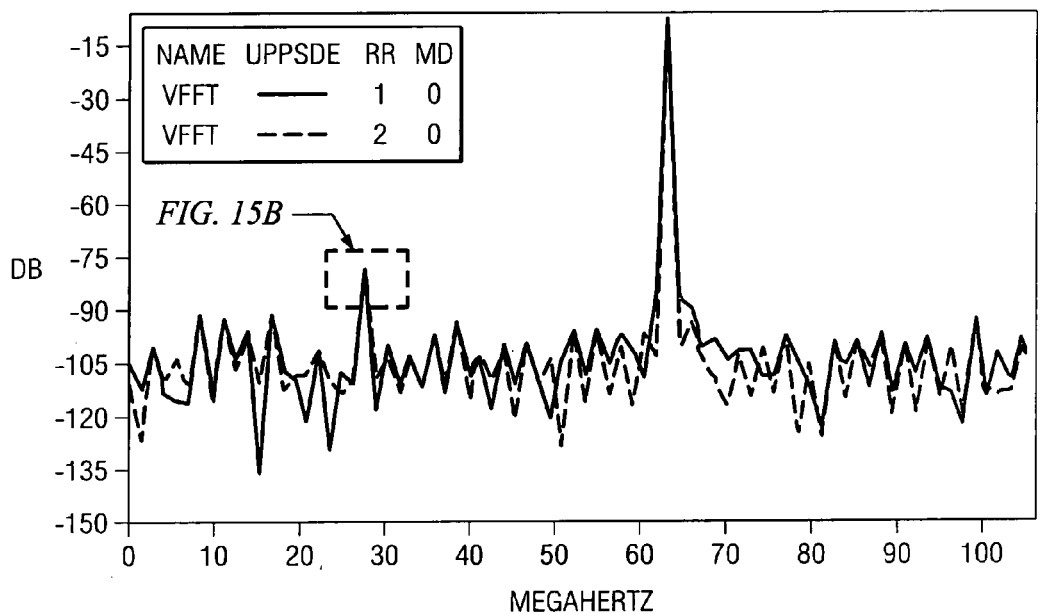
FIG. 15 illustrates the harmonics of the DAC outputs of the latch device of FIG. 12 compared to the latch of FIG. 10.
Figure 15B:
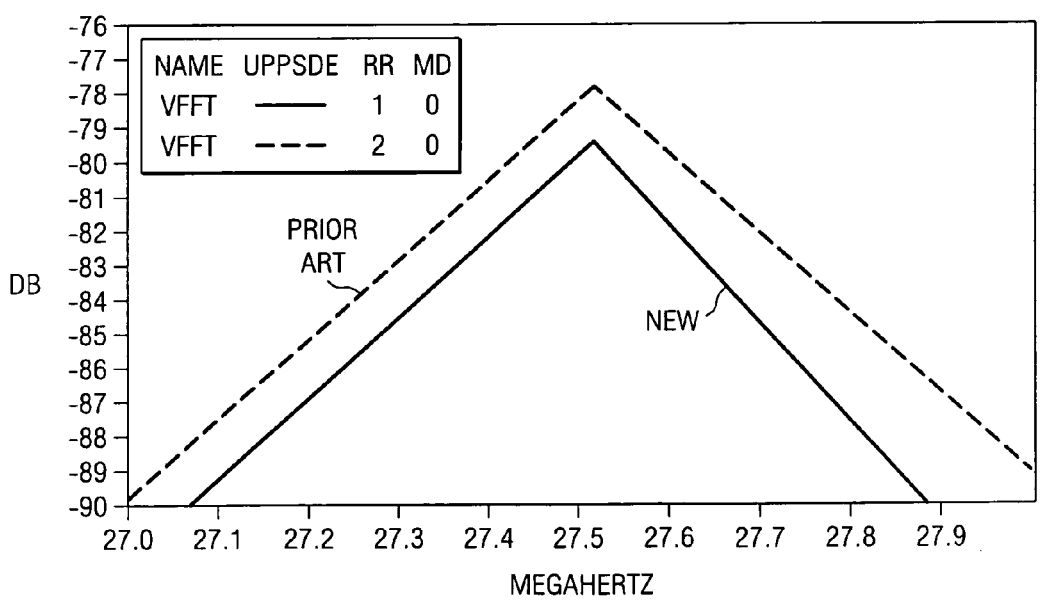

FIG. 9 shows a simulation between the latch in accordance with the present invention and the known latch architecture shown in FIG. 10. It can be seen that the transitions are very similar although the transistors of the known latch architecture have less delay compared to those of the latch in accordance with the present invention. As shown in FIG. 15, the Fast Fourier Transforms (FFTs) of the outputs for each latch implementation, however, show that the latch in accordance with the present invention tends to achieve better a Spurious Free Dynamic Range (SFDR) by approximately 2 dB. This is due to the fact that the latch in accordance with the present invention does not suffer from the code conflicts between the previous and currently held code values driving the unit current source as the known latch architecture does.

As stated previously, advantages of this design include but are not limited to a novel latch architecture for driving unit current cell of a current-steering digital-to-analog converter (DAC) that provides synchronous control signals at its output switches, reduces the drain-source voltage variation of the output current-source transistors. Moreover, this latch architecture reduces the coupling of unwanted injection of input digital signals as well as clock signals. Compared to prior architectures, this latch helps to achieve lower glitch during code transition with improved dynamic performance. This novel latch structure has better dynamic performance in most known current-steering DACs. The latch effectively uses the intrinsic RC delay of transistors, 904, 906, 932 and 934, along with the current cell (not shown) in order to achieve optimal crossing points of complementary control signals. Unwanted input injection or cross-talk is reduced by introducing transistors that are off during code transitions without compromising the DAC update speed. Conflicts between currently held and new inputs are avoided in an effort to reduce the harmonic distortion. The distortion as a result of the clock signal fed through each transistor in the first and second subcircuit portions cancel each other.

In the alternative, a second embodiment may have a similar architecture to that shown in FIG. 12 which is adapted to drive NMOS output switches included within a DAC current cell.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A digital-to-analog converter (DAC) coupled to receive at least one digital input signal and a clock signal, comprising:
 a current cell driving circuit for generating first and second synchronous control signals, wherein the current cell driving circuit includes
   a decoder to decode the digital input signal into a first and second code sequence signal, and
   a latch for latching the first and second code sequence signal depending upon the clock signal and for providing the first and second synchronous control signal, wherein the latch includes a plurality of transistors; and a current cell, having a plurality of output current source transistors, to operate as a current source depending upon the first and second synchronous control signals;

wherein the latch reduces the drain to source voltage variation of the plurality of output current source transistors and reduces the coupling of unwanted injection of the digital input signal and the clock signal by maintaining the plurality of transistors of the latch in the off position during code transitions without compromising the DAC update speed.

2. A digital-to-analog converter (DAC) as recited in claim 1, wherein the latch comprises:

a first subcircuit portion having a first input node and first output node, wherein the first input node coupled to receive the first differential signal to enable the first differential signal to be transmitted when the clocking signal is high;

a second subcircuit portion having a second input node and second output node wherein the second input node coupled to receive the second differential signal to enable the second differential signal to be transmitted when the clocking signal is high;

a first PMOS transistor, having a gate, a drain and a source, the source coupled to the power supply, the gate coupled to receive the clocking signal;

a second PMOS transistor, having a gate, a drain and a source, the source coupled to the drain of the first PMOS transistor, the gate coupled to the first output node of the first subcircuit portion;

a third PMOS transistor, having a gate, a drain and a source, the source coupled to the drain of the first PMOS transistor, the gate coupled to the second output node of the second subcircuit portion;

a first inverter, having an input and output, the first inverter coupled between the drain of the second PMOS transistor and the drain of the third PMOS transistor;

a second inverter, having an input and output, the second inverter coupled in parallel with the first inverter, wherein the input of the first inverter coupled to the output of the second inverter and the output of the first inverter coupled to the input of the second inverter;

a third inverter coupled to the drain of the second PMOS transistor; and a fourth inverter coupled to the drain of the third PMOS transistor.

3. A apparatus as recited in claim 2, wherein the first subcircuit portion comprises:

a first NMOS transistor having a gate, a source, and a drain, the gate coupled to receive the inverted clock signal, a fourth PMOS transistor having a gate, a source, and a drain, the gate coupled to receive the clock signal, the drain coupled to the drain of the first NMOS transistor to form a first output node, the source coupled to the source of the first NMOS transistor to form a first input node, the first input node coupled to receive the first differential signal.

4. A apparatus as recited in claim 2, wherein the a second subcircuit portion comprises:

a first NMOS transistor having a gate, a source, and a drain, the gate of the NMOS transistor coupled to receive the inverted clock signal, a fourth PMOS transistor having a gate, a source, and a drain, the gate coupled to receive the clock signal, the drain coupled to the drain of the first NMOS transistor to form a second input node, the source coupled to the source of the first NMOS transistor to form a second output node, the first input node coupled to receive the second differential signal.

* * * * *